(12) United States Patent  (10) Patent No.: US 7,588,636 B2
Nakamura  (45) Date of Patent: Sep. 15, 2009

(54) METHOD OF PRODUCTION OF SILICON CARBIDE SINGLE CRYSTAL

(75) Inventor: Masateru Nakamura, Toyota (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 416 days.

(21) Appl. No.: 10/566,607

(22) PCT Filed: Nov. 19, 2004

(86) PCT No.: PCT/JP2004/017652

§ 371 (c)(1),
(2), (4) Date: Jan. 31, 2006

(87) PCT Pub. No.: WO2005/053003

PCT Pub. Date: Jun. 9, 2005

(65) Prior Publication Data

US 2006/0292057 A1 Dec. 28, 2006

(30) Foreign Application Priority Data

Nov. 25, 2003 (JP) ............................. 2003-394083

(51) Int. Cl.
C30B 29/38 (2006.01)
(52) U.S. Cl. ........................... 117/37; 117/951; 117/13; 117/54; 117/60; 117/73
(58) Field of Classification Search ................. 423/344, 423/345; 117/951, 37
See application file for complete search history.

(56) References Cited

U.S. PATENT DOCUMENTS 4,349,407 A * 9/1982 Lundberg ..................... 117/79

(Continued)

FOREIGN PATENT DOCUMENTS

JP A 2000-264790 9/2000

(Continued)

OTHER PUBLICATIONS

Hoffman, D. H., et al. "Prospects of the use of liquid phase techniques for the growth of bulk silicon carbide crystals" Materials Science and Engineering B, Elsevier Sequoia, Lausanne, Ch, vol. 61-62, Jul. 30, 1999, pp. 29-39, XP004363298 ISSN: 0921-5107.

Primary Examiner—Melvin C Mayes
Assistant Examiner—Melissa Stalder
(74) Attorney, Agent, or Firm—Oliff & Berridge, PLC

(57) ABSTRACT

A method of production of a silicon carbide single crystal enabling fast, stable, and continuous growth of a high quality silicon carbide single crystal and enabling both an increase in size of the bulk single crystal and an improvement of quality of a thin film single crystal, comprising stacking, in order from the bottom, a silicon carbide source material rod, a solvent, a seed crystal, and a support rod supporting the seed crystal at its bottom end so as to form a columnar workpiece, heating a bottom end of the source material rod as a bottom end of the columnar workpiece, and cooling a top end of the support rod as the top end of the columnar workpiece so as to form a temperature gradient inside the columnar workpiece so that the top end face becomes lower in temperature than the bottom end face of the solvent; and causing a silicon carbide single crystal to grow continuously downwardly starting from the seed crystal, wherein said method further comprises using an inside cylindrical susceptor tightly surrounding the outer circumference of the columnar workpiece.

11 Claims, 9 Drawing Sheets

U.S. PATENT DOCUMENTS

| | | | |
|---|---|---|---|
| 4,415,401 A * | 11/1983 | Wald et al. | 117/20 |
| 6,086,672 A * | 7/2000 | Hunter | 117/84 |
| 6,794,213 B1 * | 9/2004 | Okojie et al. | 438/52 |
| 6,863,728 B2 * | 3/2005 | Vodakov et al. | 117/202 |
| 2005/0106849 A1 * | 5/2005 | Gwo | 438/602 |

FOREIGN PATENT DOCUMENTS

JP     A 2004-315281     11/2004

* cited by examiner

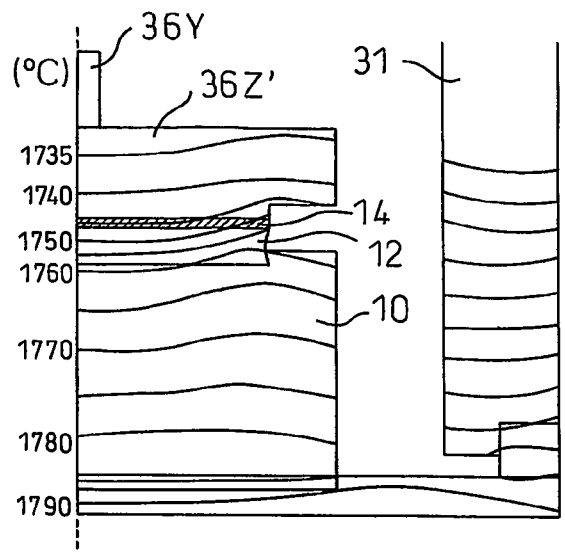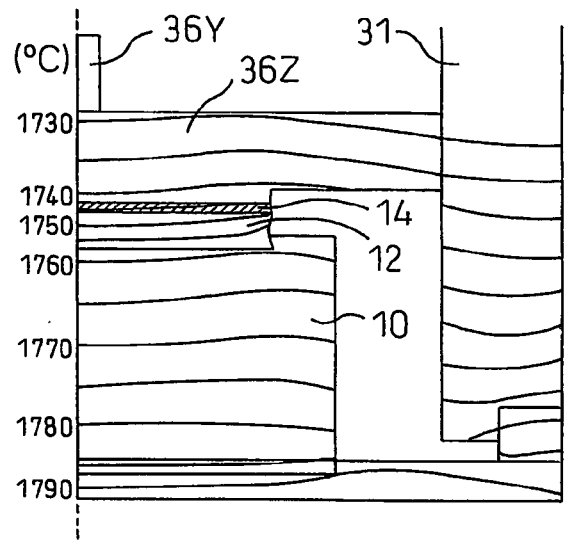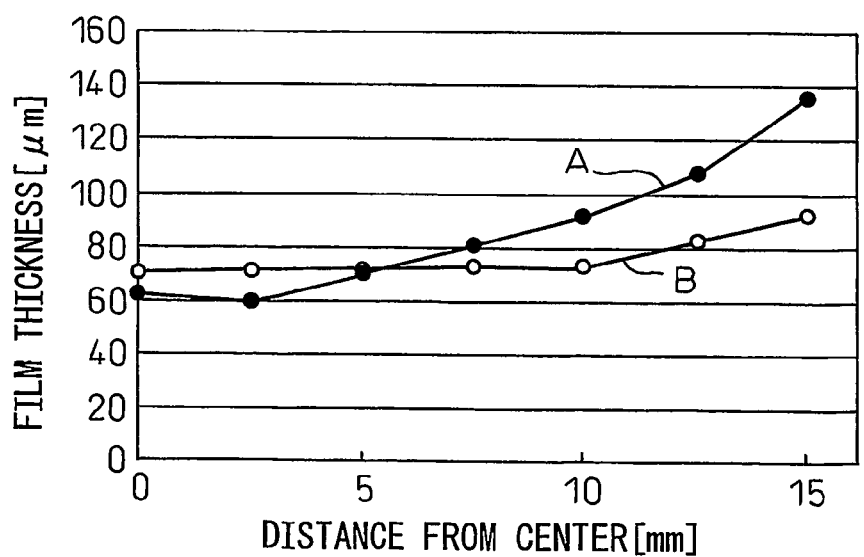

METHOD OF PRODUCTION OF SILICON CARBIDE SINGLE CRYSTAL

TECHNICAL FIELD

The present invention relates to a method of production of a silicon carbide single crystal, more particularly relates to a method of production of a silicon carbide single crystal by the solution method.

BACKGROUND ART

Silicon carbide (SiC) is promising as a semiconductor material more advantageous than silicon (Si). That is, if using silicon carbide for a semiconductor material, the withstand voltage is higher and the heat resistance is better than with silicon, so there are the advantages of a possibility of an increase in the voltage used, a reduction in loss, a reduction in size of the semiconductor chip, etc.

However, use for a semiconductor chip requires a high quality SiC single crystal greatly reduced in mozaicity, dislocation, and other faults. Further, from the viewpoints of the source material yield and production efficiency, it is important that large single crystals be able to be produced in a short time.

To obtain a single crystal of a compound which will not congruently melt (having no liquid phase state) like silicon carbide, the sublimation method and solution method are used.

The sublimation method is a method of causing a precipitating substance to subliminate at a high temperature part and precipitate from the vapor phase onto a seed crystal arranged at a low temperature part. The Acheson method, Lely method, and improved Lely method are representative methods of the same. However, since the substance is precipitated from a very thin phase, these are disadvantageous in the point of a low precipitation rate and, further, the problem of unavoidable formation of micropipe defects since the growth mechanism is a flank mechanism of spiral growth from the steps of the surroundings of spiral dislocations.

On the other hand, the solution method is a method of sufficiently dissolving a precipitating substance in a solvent at a high temperature part and causing a supersaturated state on a seed crystal arranged at a low temperature part to cause precipitation. The top-seeded solution growth (TSSG) method is representative of this. As one example of the solution method, Japanese Unexamined Patent Publication (Kokai) No. 2000-264790 discloses a method of dissolving a material including at least one type of transition metal element, silicon, and carbon by heating to form a melt and cooling this melt so cause precipitation and growth of a silicon carbide single crystal. According to the solution method, the solute concentration of the solvent can be adjusted, so the above problems of the vapor phase method can be solved, but the concentration gradient fluctuates according to the precipitated location due to the following reasons, so it is extremely difficult to obtain a uniform state of growth.

(1) The growth rate is still slow (0.1 mm/h or so). The growth rate can be accelerated by means such as making the concentration gradient near the precipitating parts sharp, but the precipitation state would become unstable and a high quality single crystal would not be able to be grown.

(2) The temperature gradient changes along with changes in the shape of the workpiece (heated object, including the source material (or crucible), solvent, seed crystal, support rod, etc.) or amount of source material charged. That is, in the temperature gradient, rather than control at the system side, the position and shape of the workpiec or heat source is a greater control factor, so obtaining a desired temperature gradient requires repeated calculation at the design stage and measurement of actual temperatures. Naturally, if the shape of the heated object is changed, the temperature gradient will change as well. The relative position with the heat source therefore has to be adjusted by trial and error.

(3) Achieving a uniform in-plane temperature distribution vertical to the crystal growth axis is difficult. The reasons are that any heating is from the outside surface of the workpiece and that the substance acting as the heat medium is a fluid such as a vapor phase or liquid phase and therefore convection affects the temperature distribution.

As a result, with a method of production of a silicon carbide single crystal by the conventional solution method, there were limits to improvement of the yield by increasing the size of the bulk single crystal.

On the other hand, silicon carbide single crystal is not only used in the bulk state. It also has a high value of use for semiconductor devices as the thin film formed on the surface of a seed crystal (so-called "epitaxial film"). In the past, in general, such a silicon carbide thin film has been formed by causing vapor phase growth by the chemical vapor deposition (CVD) method using silane and propane as the silicon source and carbon source. However, there were the defects of faults present in the seed crystal used as the substrate in the epitaxial growth from the vapor phase, in particular, in the case of silicon carbide, micropipes formed from the large Burgers vector hollow spiral dislocations, being passed along to the epitaxial growth film.

Therefore, with a silicon carbide single crystal thin film obtained by the conventional vapor phase growth, there were limits to the increase in quality through the reduction of faults.

DISCLOSURE OF THE INVENTION

An object of the present invention is to provide a method of production of a silicon carbide single crystal enabling fast, stable, and continuous growth of a high quality silicon carbide single crystal and enabling both an increase in size of the bulk single crystal and an improvement of quality of a thin film single crystal.

To attain the above object, according to a first aspect of the present invention, there is provided a method of production of a silicon carbide single crystal by precipitation from a solution using a temperature gradient furnace giving a temperature gradient to a columnar workpiece in its longitudinal direction, comprising using as the temperature gradient furnace a temperature gradient furnace provided with heat insulating walls surrounding an outer circumference of the columnar workpiece, a heating unit for heating a bottom end of the columnar workpiece through a heating susceptor, and a cooling unit for cooling a top end of the columnar workpiece through a cooling susceptor; stacking, inside the furnace in order from the bottom, a source material rod comprised of silicon carbide, a solvent, a seed crystal, and a support rod supporting the seed crystal at its bottom end so as to form the columnar workpiece, heating a bottom end of the source material rod as the bottom end of the columnar workpiece by the heating unit, and cooling a top end of the support rod as the top end of the columnar workpiece by the cooling unit so as to form a temperature gradient inside the columnar workpiece so that the top end face becomes lower in temperature than the bottom end face of the solvent; and causing a silicon carbide single crystal to grow continuously downwardly starting from the seed crystal, wherein the method further comprises using an inside cylindrical susceptor tightly surrounding the outer circumference of the columnar workpiece.

According to a second aspect of the invention, there is provided a method of production of a silicon carbide single crystal by precipitation from a solution using a temperature gradient furnace giving a temperature gradient to a columnar workpiece in its longitudinal direction, comprising using as the temperature gradient furnace a temperature gradient furnace provided with heat insulating walls surrounding an outer circumference of the columnar workpiece, a heating unit for heating a bottom end of the columnar workpiece through a heating susceptor, and a cooling unit for cooling a top end of the columnar workpiece through a cooling susceptor; stacking, inside the furnace in order from the bottom, a source material rod comprised of silicon carbide, a solvent, a seed crystal, and a support rod supporting the seed crystal at its bottom end so as to form the columnar workpiece, heating a bottom end of the source material rod as the bottom end of the columnar workpiece by the heating unit, and cooling a top end of the support rod as the top end of the columnar workpiece by the cooling unit so as to form a temperature gradient inside the columnar workpiece so that the top end face becomes lower in temperature than the bottom end face of the solvent; and causing a silicon carbide single crystal to grow continuously downwardly starting from the seed crystal, wherein the method further comprises using as the source material rod a source material rod provided with a counter bore of an inside diameter equal to an outside diameter of the seed crystal on the top face and pulling up the support rod at the time where a predetermined thickness of the single crystal is grown so as to detach the single crystal from the solvent.

According to the first aspect of the invention, by using an inner cylindrical susceptor tightly surrounding the outer circumference of a columnar workpiece, (1) a monoaxial heat flow along the longitudinal axis of the columnar workpiece (=crystal growth axis) is realized, so fast, stable crystal precipitation becomes possible, (2) constant workpiece shapes and dimensions can be used, so actual operation can be started immediately with the minimum amount of trials, and (3) the in-plane temperature distribution vertical to the stacking axis (=crystal growth axis) in a stacked structure comprised of a source material rod/solvent/precipitating crystal/seed crystal (hereinafter referred to as a "crystal assembly") (hereinafter referred to as the "in-plane temperature distribution") becomes uniform, so fast, stable single crystal growth becomes possible. The method of the first aspect of the invention is particularly advantageously applied to the production of a bulk large-diameter material of a silicon carbide single crystal.

Further, according to the second aspect of the present invention, by using a source material rod is provided with a counter bore with an inside diameter equal to the outside diameter of the seed crystal at its top face, the in-plane temperature distribution of the crystal assembly becomes uniform in state. Since the linear expansion coefficient of the solvent is greater than that of the silicon carbide, however, the single crystal which is grown is destroyed by the thermal stress after cooling. To prevent this, in the second aspect of the invention, the support rod is pulled up at the time when the desired thickness of the single crystal is grown so as to detach the single crystal from the solvent.

The method of the second aspect of the invention is advantageously applied to the production of a silicon carbide single crystal thin film. By using the solution method, micropipes of the substrate can be easily closed, so it is possible to easily reduce the faults which unavoidably occurred with the vapor-phase method and obtain a high quality single crystal. Further, the system configuration is simple and high in safety, so is extremely practical.

BRIEF DESCRIPTION OF THE DRAWING

FIGS. 9A and 9B are vertical sectional views of the in-plane temperature distribution in the case of FIG. 7.

FIG. 10 is a graph of the thickness distribution of a thin film single crystal of silicon carbide formed using the case of FIG. 7.

BEST MODE FOR WORKING THE INVENTION

First Embodiment

Figure 1:
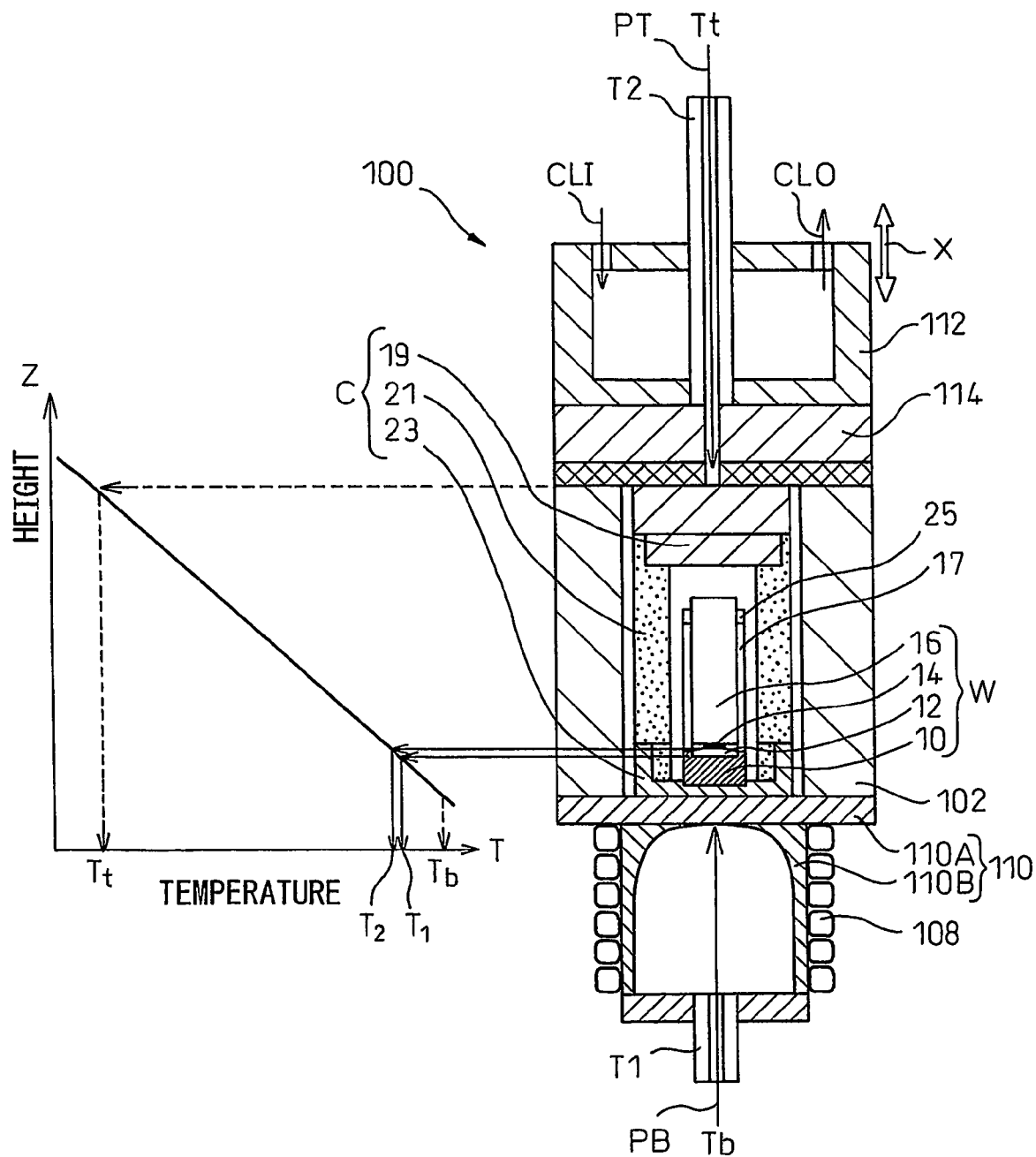
FIG. 1 is a vertical sectional view of a temperature gradient furnace for producing a silicon carbide single crystal according to a first aspect of the present invention.
Figure 2A:
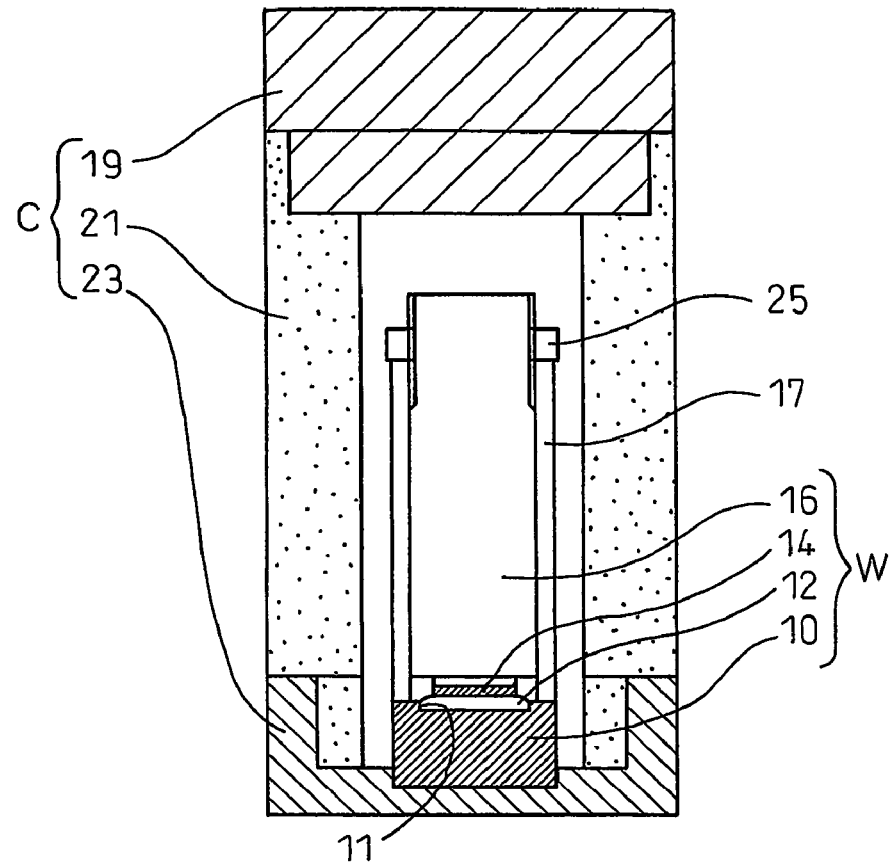
FIGS. 2A and 2B are vertical sectional views showing enlarged a case arranged inside the temperature gradient furnace of FIG. 1.
Figure 2B:
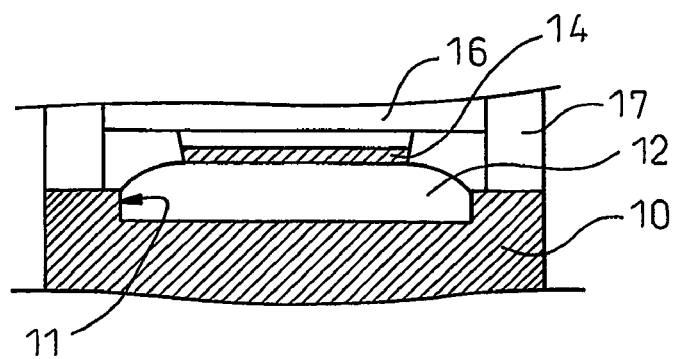

FIG. 1 and FIGS. 2A and 2B show an example of a preferred embodiment of a temperature gradient furnace used for the method of production of a silicon carbide single crystal of the first aspect of the invention. FIGS. 2A and 2B show the inside of the temperature gradient furnace of FIG. 1 enlarged.

The illustrated temperature gradient furnace 100 is provided with a substantially cylindrical body having a center axis in the vertical direction of the figure. FIG. 1 and FIGS. 2A and 2B are all vertical sectional views in the plane including the center axis of the cylindrical body. The cylindrical body 102 is made of a heating insulating material. Inside it a top heat conducting lid 19, heat insulating cylinder 21, and bottom heat conducting lid 23 forming a case C are arranged. Inside the case C, a source material rod 10, a solvent 12, a seed crystal 14, and a support rod 16 forming a columnar workpiece W are accommodated in a state fixed by the bottom end being inserted into the bottom face of the case C (FIG. 2A). Due to this, the heat flow through the outer circumference of the workpiece W is substantially blocked and heat can flow only through the top end and the bottom end.

Due to this, a temperature gradient having the bottom end (heated end) of the case C accommodating the columnar workpiece W as the highest temperature Tb and having the top end (cooled end) of the case C as the lowest temperature Tt, that is, a temperature gradient falling in temperature monotonously from the bottom to the top of the case C, is formed along the longitudinal direction of the case C. The columnar workpiece W accommodated in the case C is also formed with this temperature gradient.

The bottom end face of the case C is a disk-shaped flat surface and is heated by an induction heating coil 108 below it. A heating susceptor 110 interposed between the induction heating coil 108 and case C is comprised of a disk-shaped flange part 110A coming into close contact with the bottom end face WB of the columnar workpiece W and a columnar part 110B heated by induction heating. The induction heating coil 108 is arranged wrapped around the columnar part 110B of the susceptor 110. By adopting this structure, the temperature reached becomes higher and the uniformity of the in-plane temperature distribution is further improved compared with a structure where the susceptor 110 is made a simple disk in shape.

Further, the columnar part 110B is made substantially cylindrical in shape with the parts other than right near the flange part 110A made hollow. If the columnar part 110B were made entirely solid, the outer circumference of the columnar part 110B directly heated by the induction coil 108 would become high in temperature and the core of the columnar part 110B heated by only heat conducted from the outer circumference would become low in temperature. This is not preferable for securing uniformity of the horizontal sectional in-plane temperature distribution. By making the parts other than right near the flange part 110A hollow like in this embodiment, the uniformity of the in-plane temperature distribution can be further raised.

Due to the heating use susceptor 110 interposed between the induction heating coil 108 and bottom end of the case C in this way, the flow of heat from the resistance heating coil 108 to the bottom end face WB of the workpiece is equalized and the entire bottom end face WB of the workpiece is equally heated. The heating use susceptor 110 is fabricated from a disk of a metal with a good conductivity such as copper so as to secure a high heating efficiency.

The top end face of the columnar workpiece W is also a disk-shaped flat surface and is cooled by a water-cooling type cooler 112 having a flat disk-shaped cooling surface. The cooler 112 is of a type of a cooling jacket fabricated by a metal with good heat conductivity such as copper. In the illustrated example, the top end has an inflow port CLI and an outflow port CLO. The rest of the parts are water-tight in structure. Due to the cooling use susceptor 114 interposed between the cooler 112 and the top end face of the case C, the flow of heat from the top end face of the case C to the cooler 112 is equalized and the entire top end face of the case C is equally cooled. The cooling use susceptor 114 has to secure a suitable heat removal action so as to prevent excessively rapid cooling and enable the necessary gradual cooling. Therefore, it is made of graphite etc. having heat resistance and a suitable heat insulating property.

The cooler 112 can move up and down as shown by the double-headed arrow W in FIG. 1. This enables the distance $\Delta t$ from the susceptor 114 to be suitably adjusted in accordance with need and enables a suitable amount of heat removal to be set (in the illustrated example, $\Delta t=0$ or the two are in close contact).

The temperature Tb of the heated bottom end of the case C is monitored by a pyrometer from the outside through a pipe T1 passing through the center of the heating coil 108 and heating use susceptor 110 (monitoring optical path: arrow PB). By adjusting the output of the induction heating coil 108 based on the value of this monitored temperature, the heating temperature is controlled.

The temperature Tt of the cooled top end face of the case C is monitored by a pyrometer from the outside through a pipe T1 passing through the center of the cooler 112 and cooling use susceptor 114 (monitoring optical path: arrow PT). By adjusting the temperature and flow rate of the cooling water supplied to the water-cooling type cooler 112 based on the monitored value, the amount of heat removal (cooling strength) can be adjusted.

By performing the heating at the bottom end of the case C and the cooling at the top end in this way using the heating use susceptor 110 and the cooling use susceptor 114 respectively, the flow of heat passing through the horizontal cross-section (plane perpendicular to longitudinal direction) can be made constant over the entire length of the columnar workpiece and simultaneously the distribution of the heat flow in the horizontal cross-section can be made uniform, so the temperature gradient falling monotonously from the bottom to the top of the columnar workpiece W can be given an extremely high linearity and simultaneously the temperature distribution in the horizontal cross-section can be made uniform.

Due to this, inside the temperature gradient furnace 100, a linear temperature gradient is formed in the height direction as shown by the left half of FIG. 1. Along this temperature gradient, the solvent 12 is held at a high temperature T1 at the bottom end face (=face contacting top end face of source material rod 10) and at a low temperature T2 at the top end face (=surface contacting bottom end face of seed crystal 14 (or crystal surface being grown)). Near the bottom end face of the solvent 12 (surface contacting source material rod), silicon and carbon dissolve into the solvent 12 from the source material rod 10 in accordance with the solubilities of silicon and carbon in the solvent 12 at the high temperature T1, while near the top end face of the solvent 12 (surface contacting seed crystal 14 (or crystal growth interface)), silicon and carbon in the solvent 12 precipitate on the seed crystal 14 (or crystal surface being grown) as silicon carbide in accordance with the degree of supersaturation of silicon and carbon in the solvent 12 at the low temperature T2, whereby growth of the silicon carbide single crystal proceeds.

Along with the progress in crystal growth, the top end of the source material rod 10 descends due to elution of the source material substance and simultaneously the crystal growth face (bottom face of crystal) descends, so the solvent 12 sandwiched between the two automatically descends. At this time, the temperature gradient in the solvent is kept constant along with the graph of FIG. 1 at all times. When the height of the single crystal grown is small (for example, 10 mm to 20 mm or so: within height of source material rod 10), even if maintaining the high temperature Tb of the bottom end of the case C and the low temperature Tt of the top end at their initial settings, it is possible to secure a solubility in the source material elution region of the solvent and a degree of supersaturation in the crystal precipitation region within ranges suitable for crystal growth. When the height of the crystal grown is large, by simultaneously lowering Tb and Tt in synchronization with the crystal growth, it is possible to maintain the necessary temperature gradient and the temperatures of the source material elution region and crystal precipitation region within ranges suitable for crystal growth.

With the conventional crystal growth method, in particular, to grow a long single crystal, a ring-shaped heating source for heating the vicinity of the solvent from its surroundings was moved to move the solvent position. However, this required mechanical movement, so there was the problem that the unavoidably accompanying slight mechanical vibration induced formation of multiple crystal nuclei and therefore resulted in a susceptibility toward polycrystallinity.

According to the present invention, by just changing the high temperature Tb and the low temperature Tt in synchronization, long crystal growth can be realized. Since no mechanical movement is required, the problems such as in the past in principle will not arise. Due to this, it is possible to obtain a high quality, long single crystal by a simplified system configuration and operation method.

One characterizing feature of the first aspect of the invention is the adoption of a configuration with the columnar workpiece W tightly wrapped around its outer circumference by an inner cylindrical susceptor 17. Due to this, an in-plane temperature distribution vertical to the stacking axis (=crystal growth axis) in a columnar workpiece W, in particular a stacked structure comprised of a source material rod 10/solvent 12/precipitating crystal (not shown)/seed crystal 14 ("crystal assembly") ("in-plane temperature distribution") is made highly uniform, so fast, stable growth of silicon carbide single crystal becomes possible.

Figure 3A:
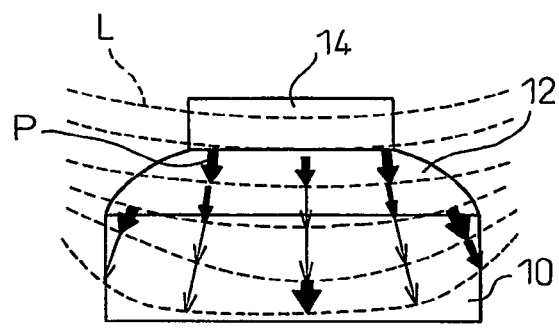
FIGS. 3A and 3B are vertical sectional views schematically showing the relationship between the in-plane temperature distribution in a crystal assembly and the flatness of the obtained single crystal.
Figure 3A:
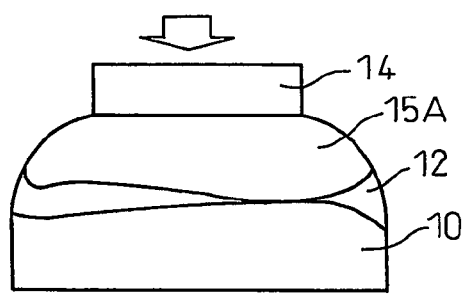
Figure 3B:
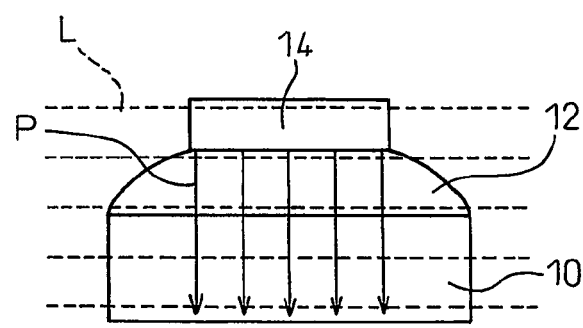
Figure 3B:
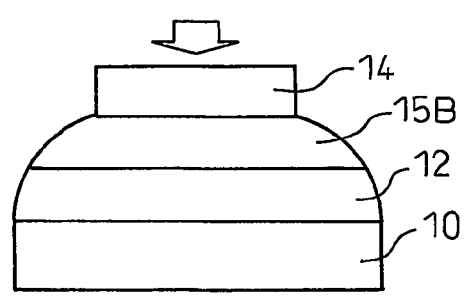

Referring to FIGS. 3A and 3B, actions and effects of the first aspect of the invention will be explained. When no inner cylindrical susceptor 17 is used, the uniformity of the in-plane temperature distribution is low, so as shown by the top half of FIG. 3A, the isotherm planes L bend irregularly and the interplane distances become uneven. That is, the temperature gradient P does not become linear in the vertical direction of the figure, but becomes uneven. Crystal growth proceeds along the temperature gradient P, so as shown by the bottom half of FIG. 3A, crystal 15A of a curved surface with the growth interface becoming unevenly wavy is grown and growth is even stopped locally.

As opposed to this, according to the first aspect of the invention, when using the inner cylindrical susceptor 17, the in-plane temperature distribution is made uniform, so as shown in the top half of FIG. 3B, the isotherm planes L become flat and the interplane distances also become even. That is, the temperature gradient P becomes linearly aligned in the vertical direction of the figure and crystal grows along with this, so as shown in the bottom half of FIG. 3B, the growth interface becomes flat and a crystal 15B with a good flatness is continuously grown.

In this embodiment, as illustrated, the inner cylindrical susceptor 17 is placed on the top circumferential edge of the seed crystal 10 and the support rod 16 is held suspended at the top end. That is, the support rod 16 has a thread cut into it at the top outer circumference. A nut-shaped ring-shaped member 25 is screwed over this thread. The ring-shaped member 25 abuts against the top end of the inner cylindrical susceptor 17, whereby the support rod 16 is held suspended at a predetermined height. This suspension holding method is adopted for the following reasons.

At the time of start of crystal growth, the seed crystal 14 has to contact the surface of the solvent 12. However, the solvent 12 is inserted as a disk-shaped or other solid at the time of loading, is melted in the process of sublimation due to the start of operation of the temperature gradient furnace 100, and expands in volume at the time of becoming a solution, so increases in height from the time of insertion. Accordingly, at the time of loading, the seed crystal 14 has to be placed a suitable distance slightly above the top face of the solid solvent. Further, the amount of change of the height of the solvent differs depending on the type of the solvent, so the height of the seed crystal 14 has to be able to be made a continuous value, not step-wise value.

Accordingly, as one method, structuring the seed crystal 14 to be connected from the top lid 19 of the case C may be considered, but the temperature distribution of the crystal assembly is liable to be disturbed by the connection with the low temperature top.

As opposed to this, in the present embodiment, by holding the top end of the inner cylindrical susceptor 17 suspended by the screw-type ring-shaped member 25, it is possible to continuously adjust the height of the seed crystal 14 without disturbing the temperature distribution of the crystal assembly.

Another characterizing feature of this embodiment is the provision of a counter bore 11 on the top face of the source material rod 10 for carrying the solvent 12. The solvent 12, present as a melted zone between the seed crystal 14 and the source material rod 10, has to be maintained stably in shape by just its surface tension. However, depending on the type of the solvent, due to the surface fluidity, the material will flow out to the side faces of the source material rod 10 and the melted zone will not be able to be maintained, so single crystal growth will not be possible or will be interrupted. By provision of the counter bore 11 at the top face of the source material rod 10 and holding the solvent 12 inside it, outflow can be prevented and the melted zone can be maintained stably over a long period of time extremely easily. Note that the shape of the counter bore 11 is not limited to a cylindrical shape (flat bottomed) as illustrated and may also be a spherical shape or any other shape so long as it contributes to the stable growth of the crystal.

Second Embodiment

A preferred embodiment of the solvent used in the present invention will be explained next.

The method of production of a silicon carbide single crystal of the present invention is a solution method utilizing a dissolving and precipitation reaction through a solvent. As the solvent, silicon, one of the component elements of silicon carbide, has been used in the past. However, the crystal growth rate achieved in the past using silicon as a solvent has been an extremely slow 0.02 to 0.03 mm/sec. This is poor in industrial practicality.

As opposed to this, by forming the solvent of the present invention by silicon and at least one type of coexisting element selected from the group of Y, Sc, lanthanoids, elements of Group I of the Periodic Table, and elements of Group II of the Periodic Table, the crystal growth rate can be remarkably improved as explained in detail in the examples.

Further, there is the following advantage. That is, the solvents disclosed in Japanese Unexamined Patent Publication (Kokai) No. 2000-264790 contain carbon from the start as a component ingredient of the solvent itself, so when the solvent changes from the solid to melted state in the process of sublimation, the silicon carbide immediately starts to precipitate. As a result, the precipitated surface becomes rough and polycrystallization is liable to occur.

As opposed to this, the solvent of the present invention does not include carbon as a component ingredient of the solvent itself, so when the solvent changes from a solid to a melted state in the process of sublimation, the solvent still does not contain carbon. After elution from the source material rod into the solvent, the carbon diffuses through the solvent and reaches the seed crystal, where precipitation is started. The process is therefore gentle. Accordingly, there is no roughening of the precipitated surface or polycrystallization as with the conventional solvent.

In addition, in the period in the sublimation process where the carbon in the solvent reaches the saturation concentration near the seed crystal, the surface of the seed crystal also dissolves in the solvent somewhat. Due to this, the work affected layer of the seed crystal surface is removed even without any pretreatment, so the crystallinity of the crystal precipitated on it is improved. However, in the case of a growth technique with an extremely large amount of solvent such as the TSSG method, the amount of dissolution of the seed crystal becomes large. Further, the effect of convection is difficult to completely eliminate. Therefore, the flatness of the surface of the seed crystal is liable to conversely fall or the seed crystal is liable to dissolve and precipitate. Therefore, the above effect cannot be expected. That is, the above effect can be obtained by the growth method of the present invention.

Each of the coexisting elements used in the solvent of the present invention not only has the effect of improvement of the growth rate, but also improvement of the surface flatness of the precipitated crystal due to the above action.

Third Embodiment

Figure 7:
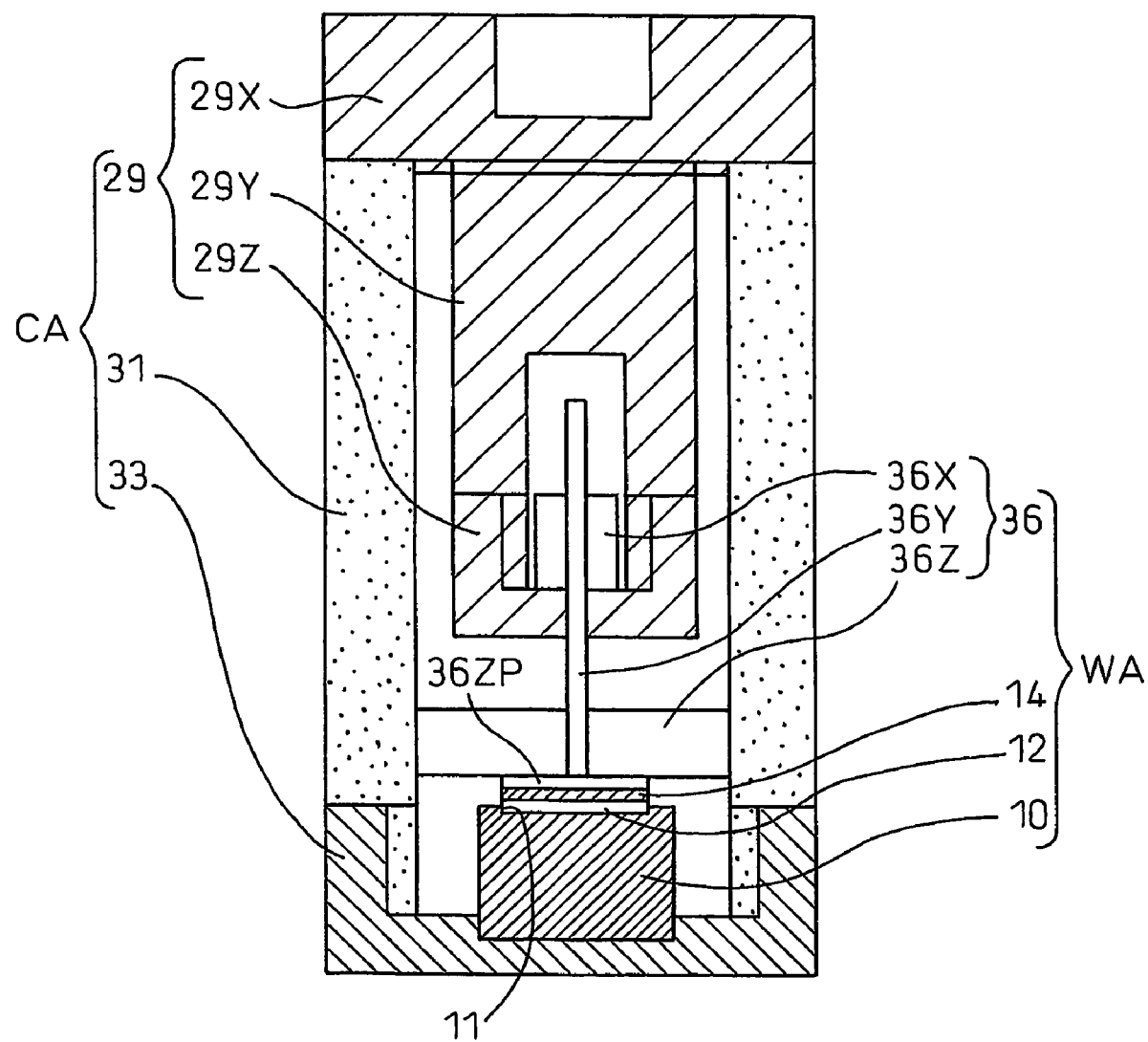
FIG. 7 is a vertical sectional view of a vertical sectional view of a case arranged inside a temperature gradient furnace used for the method of production of a silicon carbide single crystal of a second aspect of the invention.

FIG. 7 shows an example of a preferable embodiment of a case for arrangement inside a temperature gradient furnace used for the method of production of a silicon carbide single crystal of the second aspect of the invention. The temperature gradient furnace is structured as shown in FIG. 1 of the first aspect of the invention. The case arranged in the furnace however is changed in structure to one suitable for production of a single crystal thin film.

The case CA for arrangement in the furnace is comprised of a top heat conducting member 29, a heat insulating cylinder 31, and a bottom heat conducting lid 33. The top heat conducting member 29 is comprised of a top heat conducting lid 29X from the bottom of which extends a suspension member 29Y having a thread at the bottom end to which a cap nut 29Z is screwed.

The source material rod 10, solvent 12, seed crystal 14, and support rod 36 form a columnar workpiece WA held with its bottom end inserted into the bottom surface of the case CA. The top face of the source material rod 10 is provided with a counter bore 11 in the same way as the first embodiment. The solvent 12 is held in the counter bore 11. The support rod 36 is comprised of a small diameter rod part 36 at the top of which a nut 36X is screwed and at the bottom end of which a large diameter sliding disk 36 is affixed. The rod 36Y of the support rod 36 is inserted at its center part vertically movably in a center bore of the cap nut 29Z at the bottom end of the top heat conducting member. The bottom face of the nut 36X of the support rod 36 abuts against the top face of the cap nut 29Z of the top heat conducting member 29, whereby the entire support rod 36 is held suspended by the top heat conducting member 29. At the time of loading, the nut 36X can be turned so as to finely adjust the height of the support rod 36 as a whole and set the seed crystal 14 to the optimal initial height.

One of the characterizing features of this embodiment is that a seed crystal holder 36ZP at the center of the bottom face of the sliding disk 36Z at the bottom end of the support rod 36, the seed crystal 14, and the counter bore 11 are made the same diameter. Due to this, like in the first embodiment, even without using the inner cylindrical susceptor 17, the flatness of the isotherm planes of the crystal assembly (stacked structure of source material rod 10/solvent 12/precipitated crystal (not shown)/seed crystal) becomes excellent.

Another of the characterizing features of this embodiment is that the sliding disk 36Z at the bottom end is made large in diameter and the outer circumference is brought into contact with the inner wall surface of the heat insulating cylinder 31 of the case CA to enable sliding. Due to this, the heat input from the heat insulating cylinder 31 increases, the uniformity of temperature at particularly the outer circumference and center of the seed crystal 14 in the crystal assembly is improved, the film-forming area giving the uniform thin film single crystal is increased, and the yield is improved.

Still another characterizing feature is that the diameter of the support rod 36 is made small at the rod 36Y of the part other than the large diameter sliding disk 36Z of the bottom end. Due to this, the flow of heat upward becomes smaller. As a result, the temperature gradient becomes gentler, the flatness of the isotherm planes in the crystal assembly is improved, and a high uniformity thin film single crystal can be stably formed.

In the second aspect of the invention, a characterizing feature particularly important in the production of a thin film single crystal is the pulling up of the support rod 36 so as to detach the single crystal from the solvent 12 when a desired thickness of the single crystal has been grown. The heat expansion coefficient of the solvent 12 is larger than that of the silicon carbide single crystal, so if cooling the thin film single crystal in the state connected with the solvent 12 after the film formation, the thermal stress would cause the thin film single crystal to be destroyed. The case 36 of this embodiment is provided with a pulling mechanism for this purpose.

Figure 8A:
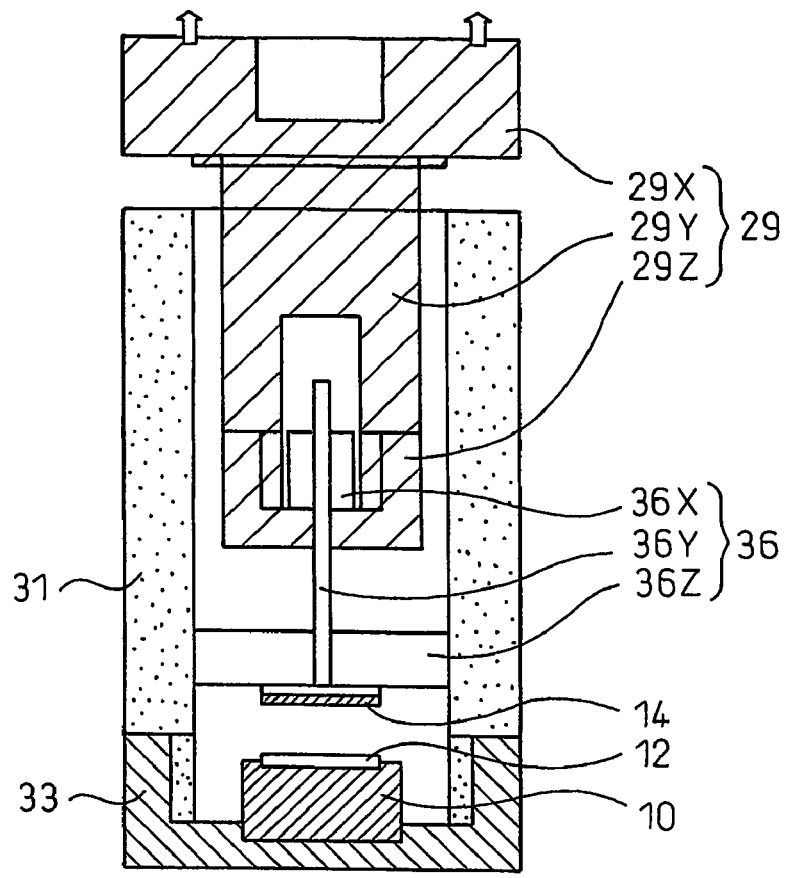
FIGS. 8A and 8B are vertical sectional views of the specific state of operation of the case of FIG. 7.

FIG. 8A shows the state of operation of the pulling mechanism. When the thin film single crystal has reached the desired thickness, the entire top heat conducting member 29 is pulled up so as to make the seed crystal 15 (on the surface of which the thin film single crystal is grown) mounted to the bottom face of the sliding disk 36Z of the bottom end of the support rod 36 detach from the surface of the solvent 12.

Figure 8B:
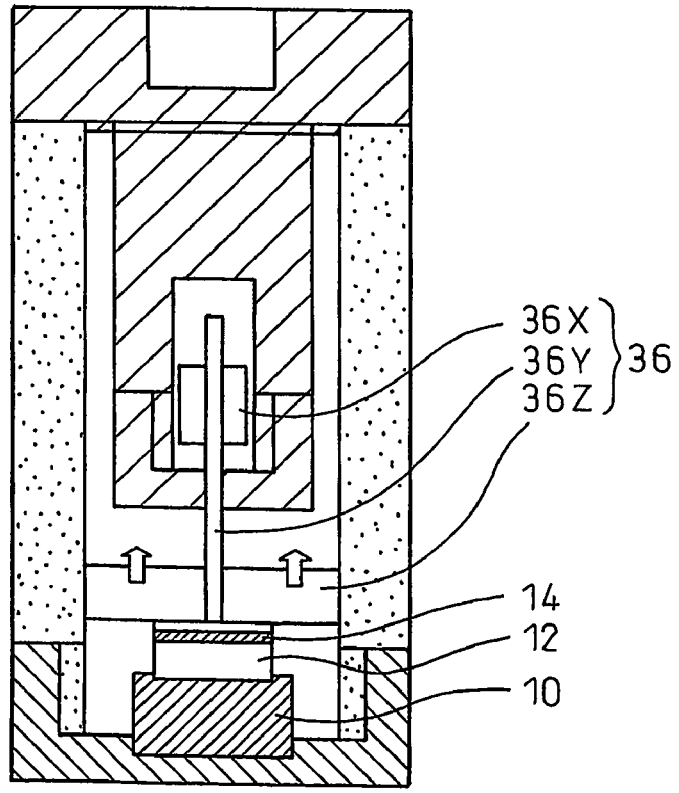

As opposed to this, FIG. 8B shows the state of operation of a buffer mechanism for dealing with the expansion of volume after loading when the sublimation causes the solid disk shaped solvent to melt and become a solution. When the seed crystal 14 loaded as a solid disk melts and expands due to heat due to the rise in temperature, the nut 36X restricts motion of the support rod 36 downward, but does not restrict motion upward, so the entire support rod 36 suspending and supporting the seed crystal 14 is pushed upward and rises. Due to this, the expansion of volume of the solvent 12 is absorbed, so generation of stress harmful to the single crystal grown can be easily avoided.

EXAMPLE 1

Figure 4A:
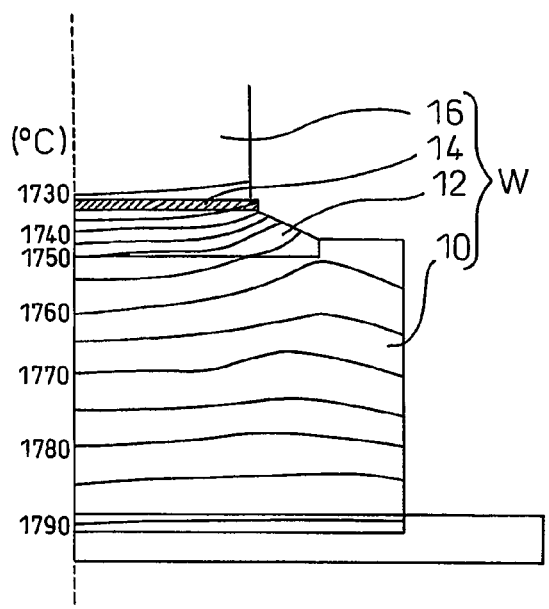
FIGS. 4A, 4B, 4AX, and 4BX are sectional views showing the relationship between the in-plane temperature distribution in a crystal assembly and the dissolved shape of the top face of the source material rod.
Figure 4B:
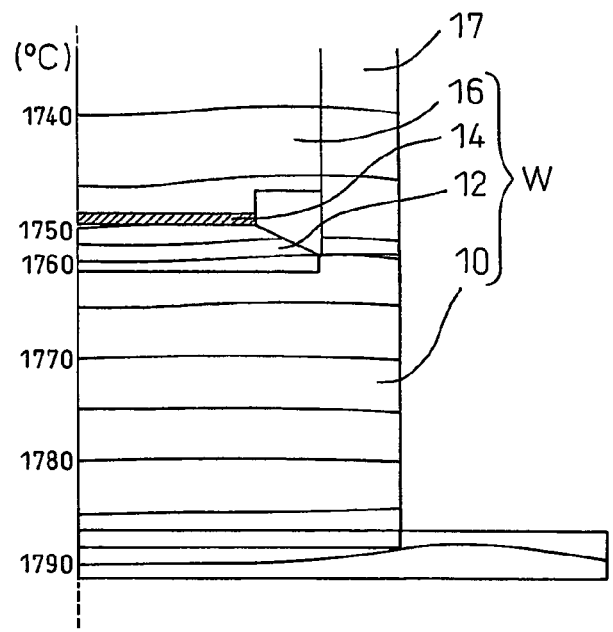
Figure 4A:
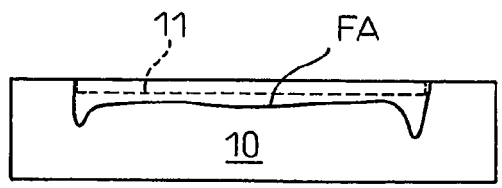
Figure 4B:
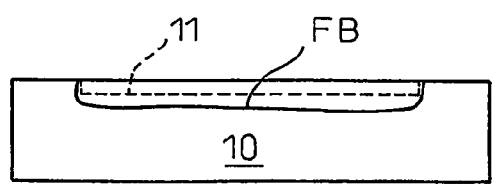

FIGS. 4A and 4B show the results of calculation and analysis of the temperature distribution in silicon carbide single crystal growth using the temperature gradient furnace 100 according to the first aspect of the invention by isotherm lines in the vertical cross-section including the center axis of the columnar workpiece W (=source material rod 10/solvent 12/seed crystal 14/support rod 16). The conditions for calculation are as follows:

[Calculation Conditions]
Program used
  Memtat (modeling): MSC
  MARC (temperature distribution calculation): MSC
  #112/#114 boundary conditions: heat conduction coefficient of 250 cal/cm$^2$·h·k
  Emission (radiation) mode coefficient utilizing automatic calculation function of above programs
Model made axial coverage model of FIGS. 4A and 4B FIG. 4A shows the case of nonuse of the inner cylindrical susceptor 17 for comparison. The temperature drops from the circumference of the columnar workpiece W to the center axis. The overall temperature distribution becomes a spherical shape projecting downward. As opposed to this, in the case of FIG. 4B using the inner cylindrical susceptor 17 according to the first aspect of the invention, an overall flat temperature distribution is obtained from the circumference of the columnar workpiece W to the center axis.

FIGS. 4AX and 4BX show sketches of the sectional shapes of the source material rods 10 obtained by experiments under the states of FIGS. 4A and 4B. The experimental conditions were as follows:

[Experimental Conditions]

Source material rod 10: SiC sintered body (sintering aid B added, density of 99.5% of theoretical density)

Solvent: YSi

Temperature: Sample case bottom end (Tb) 1850° C. (×2 hours holding)

Temperature gradient: 8 to 10 K/mm

When performing the experiment under conditions giving a downwardly projecting spherical temperature distribution (FIG. 4A) as a comparative example, as shown in FIG. 4AX, the top face of the source material rod 10 is a flat surface due to the counter bore 11 in the initial state, but elution proceeds faster at the high temperature circumference compared with the low temperature center, so the circumference becomes recessed in a deep valley-like shape leaving the center as a plateau shape resulting in a large wavy distribution FA. If crystal growth proceeds in a state with the amount of elution of material from the top face of the source material rod 10 fluctuating greatly according to position in this way, the amount of growth of the crystal precipitating as a result of diffusion and movement through the solvent 12 in the height direction will also be affected and greatly fluctuate, so a good uniformity, high quality single crystal cannot be obtained.

As opposed to this, when performing the experiment under the conditions giving a flat temperature distribution according to the first aspect of the invention (FIG. 4B), a uniform temperature is maintained across the entire top face of the source material rod 10, so the amount of elution is also equal. A flat distribution FB reflecting as is the flat surface due to the initial counter bore 11 (parallel movement) is maintained. If crystal growth proceeds in a uniform state across the entirety without fluctuation of the amount of elution of the material from the top face of the source material rod 10 due to position, the amount of growth of the crystal precipitating by diffusion and movement through the solvent 12 in the height direction will also be made uniform correspondingly and a good flatness high quality single crystal can be obtained (FIG. 4BX).

Next, an experiment was performed to investigate the effect of the counter bore 11 on the top face of the source material rod 10. The source material rod 10 was made using a disk shaped silicon carbide sintered body (20 mm diameter) like the above and provided with counter bore 11 of a diameter of 15 mm and a depth of 0.54 mm on its top face. The melted zone duration in the case of use of an FeSi solvent 12 was measured. The state of contact between the melted zone and the seed crystal was monitored by the electrical conduction between the two and any point of breakage of conduction was used to judge disconnection of the two. For comparison, a similar experiment was conducted for the case of no counter bore. The results of the experiment are shown in summary in Table 1.

TABLE 1

| | Comparative example | Invention example |
|---|---|---|
| Counter bore | No | Yes |
| Melted zone duration (hr) | 0.5 | 6.2 |

The FeSi of the solvent 12 has a high wettability with respect to the silicon carbide of the source material rod 10, so in the comparative example with the top face of the source material rod 10 left flat with no counter bore, there is remarkable outflow of the solvent due to the surface fluidity. As shown in Table 1, in 0.5 hour after the start, the melted zone ends up detaching from the seed crystal and the crystal growth can no longer be maintained. As opposed to this, in the case of provision of the counter bore according to the preferred embodiment of the first aspect of the invention, as shown in Table 1, the melted zone can be maintained up to 6.2 hours after start.

EXAMPLE 2

Solvents of various compositions according to the present invention were used to conduct experiments on the growth of silicon carbide single crystal and the growth rates of the single crystals were measured.

Figure 5:
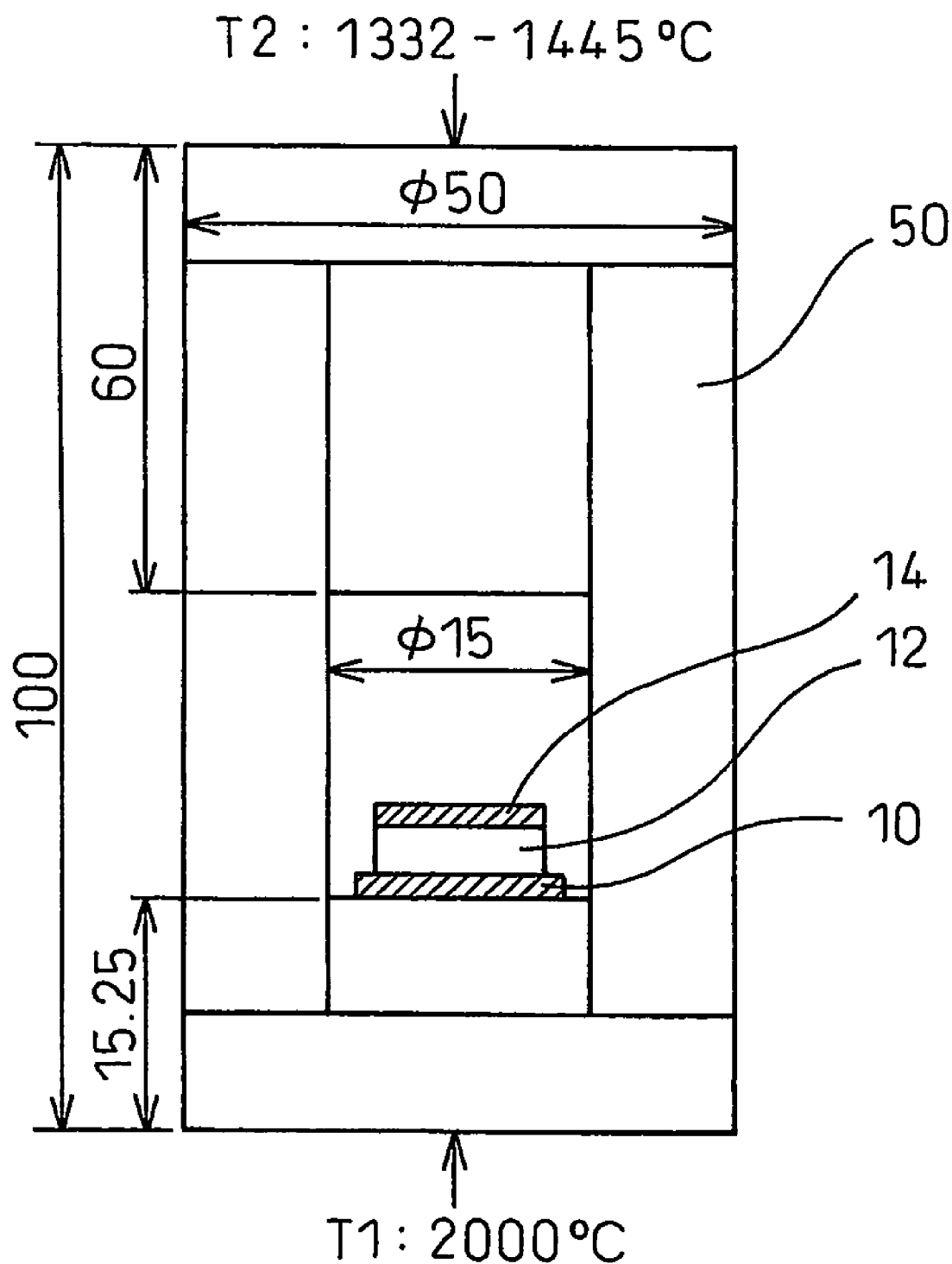
FIG. 5 is a vertical sectional view of a system used for an experiment for measuring the single crystal growth rate for various solvents.

FIG. 5 shows the experimental system. A source material rod 10, a solvent pallet 12, and a seed crystal 14 were arranged stacked in that order in a graphite cylindrical case 50 (outside diameter 50 mm×inside diameter 15×height 100 mm).

The source material rod 10 is the source of supply of the silicon and carbon for dissolution in the solvent. Polycrystalline silicon carbide wafers fabricated by CVD (5 inch diameter×0.6 mm height) were worked to disk shapes of 11 mm diameter and 0.6 mm height. Two of these disks were used stacked together. The one positioned at the solvent side was provided with a cylindrical counter bore of a diameter of 9 mm and a depth of 0.3 mm at the surface contacting the solvent. The solvent pallet 12 was a disk shape of a diameter of 7.5 to 8.5 mm and a height of 1.5 to 2.0 mm. The seed crystal 14 used was a Lely crystal (15R).

In the growth method of the present invention, to grow a good flatness, high quality single crystal, it is necessary to eliminate the effects of convection of the solvent 12 so that the movement of the substances from the source material rod 10 to the surface of the seed crystal (or crystal face being grown) is mainly performed by diffusion in the solvent 12, so the height of the solvent 12 is reduced to the above (0.6 mm×2=1.2 mm) and the source material rod 10 and seed crystal 15 are arranged brought into extremely close proximity. By introducing heat from the bottom of the case 50 and cooling the top, a temperature gradient is caused which monotonously falls along the direction from the source material rod 10 to the seed crystal 12. Note that the temperature is controlled by the measurement value (T1) of the bottom of the case 50 and that the sample temperature is an estimate from the separately measured temperature gradient line. The heating conditions are shown below:

[Heating Conditions]

Crucible bottom temperature setting: 2000° C.

Sample bottom temperature (Tsb): 1850° C. targeted (however, for some Y-based solvents, since the melting point is 1830° C., reducing the height of the bottom solid part from the 25 mm of the case of other solvents to 15 mm enables the solvent 12 to be maintained at a higher temperature).

Holding time: 2 hours

Rate of temperature rise: 16.7° C./min

Rate of temperature drop: 3.3° C./min (up to 1200° C., then furnace cooling).

Atmosphere: Air flow

The sample was raised in temperature, held, then cooled under the above conditions, then taken out from the case. The solvent was dissolved away by acid treatment to recover the grown crystal. The thickness of the obtained crystal was measured at several points by a micrometer and the difference with the thickness of the seed crystal used was used as the growth thickness.

Figure 6:
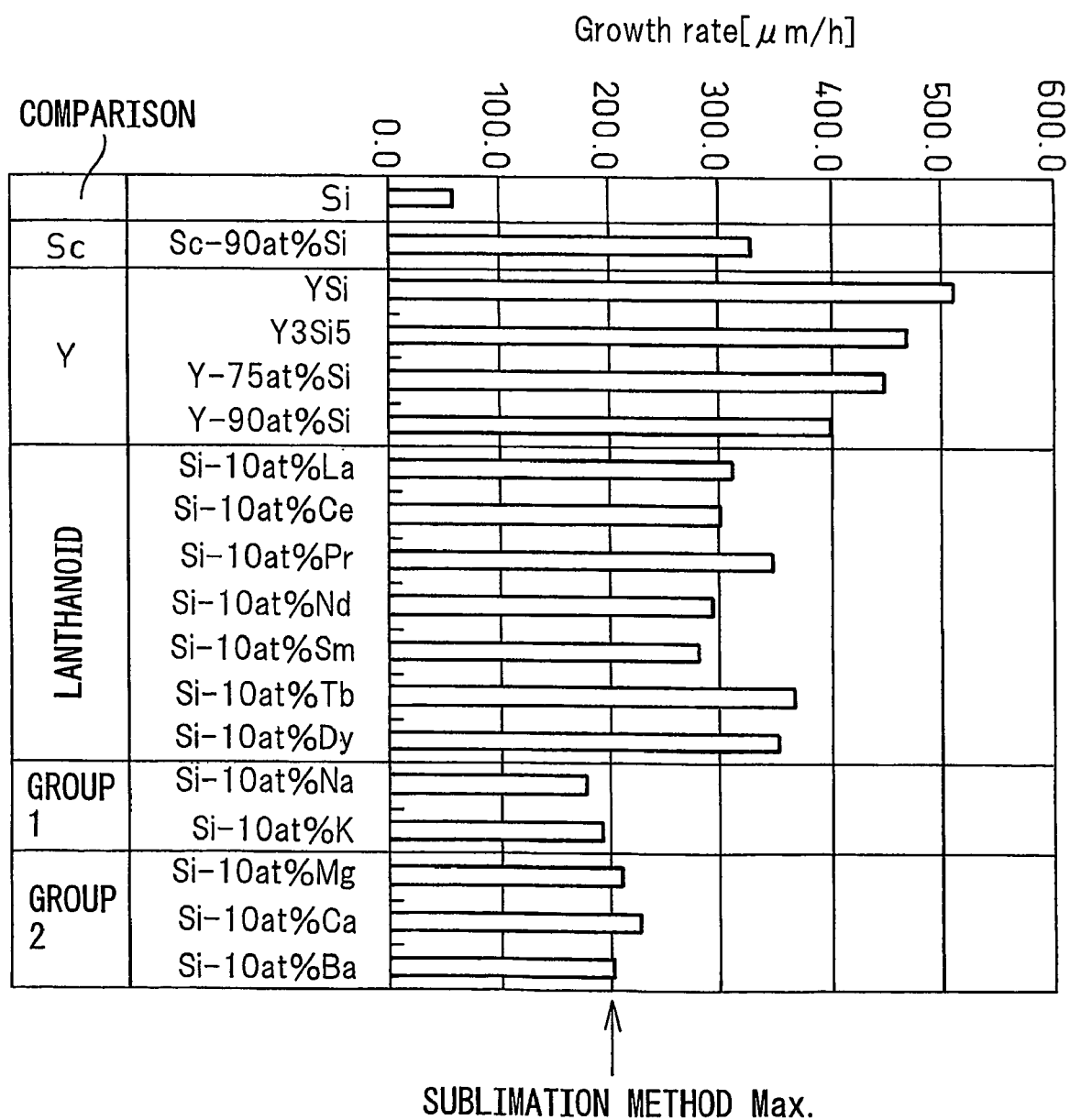
FIG. 6 is a graph showing the relationship between various solvent compositions and crystal growth rates according to the present invention.

FIG. 6 shows the crystal growth rate obtained using solvents 12 of various compositions according to the present invention. The topmost row shows the case of use of a conventional solely silicon solvent for comparison. The growth rate was about 50 μm/sec. If faster than this, there may be the to be the effect of increased speed due to the coexisting elements. Further, the arrow at the bottom end shows the highest level in the past due to the sublimation method or about 200 μm/sec. If equal or higher than this, the value can be said to be of practical value.

As illustrated, it is learned that the addition of the coexisting element Y, Sc, or Group I or II of the Periodic Table results in a striking improvement in the crystal growth rate. In particular, an about 10-fold improvement over Si alone is recognized by addition of Y. Sc and a lanthanoid can be said to have smaller effects compared with Y and result in an about 6- to 7-fold improvement over silicon alone. Further, Groups I and II of the Periodic Table are smallest in effect, but even so give the highest level of growth rate obtained up to now by the sublimation method and therefore have sufficiently practical value.

EXAMPLE 3

FIGS. 9A and 9B show the results of calculation and analysis of the temperature distribution in a case CA for arrangement inside a temperature gradient furnace according to the second aspect of the invention. The conditions for calculation are as follows:

[Calculation Conditions]

Program used

Memtat (modeling): MSC

MARC (temperature distribution calculation): MSC

112/#114 boundary conditions: heat conduction coefficient of 250 cal/cm$^2$·h·k Emission (radiation) mode coefficient utilizing automatic calculation function of above programs Model made axial coverage model of FIGS. 4A and 4B FIG. 9A shows a structure where the disk part 36Z' of the bottom end of the support rod 36 is smaller in outside diameter than the inside diameter of the heating insulating cylinder 31 of the case CA, so does not contact the inner wall surfaces thereby leaving a clearance between the two. As opposed to this, FIG. 9B shows a structure where, according to a preferred embodiment, the outer circumference of the bottom end of the support rod 36 is brought into contact with the inside wall surfaces of the heat insulating cylinder 31 of the case CA.

Comparing the two, by adopting the structure of FIG. 9B where the outer circumference of the sliding disk 36Z contacts the inside walls of the heat insulating cylinder 31 of the case CA, it is learned that the isotherm lines become flat and the region of the solvent 12 from the seed crystal 14 in particular and the uniformity of the in-plane temperature distribution is enhanced.

Using the two structures shown in FIGS. 9A and 9B, actual silicon carbide thin film single crystals were formed. The film-forming conditions were as follows:

Source material rod 10: Silicon carbide sintered body (sintering aid B added, density of 99.5% of theoretical density)

[Film-Forming Conditions]

Solvent: YSi

Seed crystal: 15 mm diameter×0.3 mm thickness (4H)

Temperature: 1750° C.

Holding time: 15 minutes

The thickness of different parts of the obtained thin film single crystals in the radial direction were measured. The results are shown in FIG. 10. In the figure, the curve A (• plot) shows the thickness of the thin film formed by the configuration of FIG. 9A with the disk outer circumference/heat insulating cylindrical inner walls not in the state of contact. The thickness is a substantially constant one of about 60 μm in a very narrow region of up to 2.5 mm toward the outer circumference from the center of the thin film. The thickness then increases the further toward the outer circumference. At the outer circumference 15 mm from the center, it increases to about 135 μm or twice that of the center.

As opposed to this, the curve B (o plot) shows the thickness of the thin film formed by the configuration of FIG. 9B with the disk outer circumference/heat insulating cylindrical inner walls in the state of contact. The thickness is a constant one of about 70 μm in a wide region of up to 10 mm toward the outer circumference from the center of the thin film. An increasing tendency is exhibited first further toward the outer circumference from this, but there is only a slight increase in thickness to about 90 μm even in the region up to 15 mm from the center. Overall, a region of at least 90% of the area of the thin film is kept within less than a 5% film thickness distribution.

INDUSTRIAL APPLICABILITY

According to the present invention, there is provided a method of production of a silicon carbide single crystal enabling fast, stable, and continuous growth of a high quality silicon carbide single crystal and enabling both an increase in size of the bulk single crystal and an improvement of quality of a thin film single crystal.

The invention claimed is:

1. A method of production of a silicon carbide single crystal by precipitation from a solution using a temperature gradient furnace giving a temperature gradient to a columnar workpiece in its longitudinal direction, comprising:

using as said temperature gradient furnace a temperature gradient furnace provided with heat insulating walls surrounding an outer circumference of said columnar workpiece, a heating unit for heating a bottom end of said columnar workpiece through a heating susceptor, and a cooling unit for cooling a top end of said columnar workpiece through a cooling susceptor;

stacking, inside said furnace in order from the bottom, a source material rod comprised of silicon carbide, a solvent, a seed crystal, and a support rod supporting said seed crystal at the bottom end of the support rod so as to form said columnar workpiece, heating a bottom end of said source material rod as said bottom end of the columnar workpiece by said heating unit, and cooling a top end of said support rod as said top end of the columnar workpiece by said cooling unit so as to form a temperature gradient inside said columnar workpiece so that the top end face becomes lower in temperature than the bottom end face of said solvent; and causing a silicon carbide single crystal to grow continuously downwardly starting from said seed crystal, wherein said method further comprises:

using an inside cylindrical susceptor tightly surrounding the outer circumference of said columnar workpiece.

2. A method of production of a silicon carbide single crystal as set forth in claim 1, further comprising carrying said inner cylindrical susceptor at its bottom end on the top end of said source material rod and suspending said support rod by a ring-shaped member screwed over its top outer circumference from the top end of said inner cylindrical susceptor so as to hold it in a manner adjustable in vertical position.

3. A method of production of a silicon carbide single crystal as set forth in claim 2, further comprising using as said source material rod a source material rod provided with one of a cylindrical or spherical counter bore at its top face.

4. A method of production of a silicon carbide single crystal as set forth in claim 2, further comprising using as said solvent one comprised of Si and at least one type of coexisting element selected from Y, Sc, a lanthanoid, an element of Group I of the Periodic Table, and an element of Group II of the Periodic Table.

5. A method of production of a silicon carbide single crystal as set forth in claim 1, further comprising using as said source material rod a source material rod provided with one of a cylindrical or spherical counter bore at its top face.

6. A method of production of a silicon carbide single crystal as set forth in claim 5, further comprising using as said solvent one comprised of Si and at least one type of coexisting element selected from Y, Sc, a lanthanoid, an element of Group I of the Periodic Table, and an element of Group II of the Periodic Table.

7. A method of production of a silicon carbide single crystal as set forth in claim 1, further comprising using as said solvent one comprised of Si and at least one type of coexisting element selected from Y, Sc, a lanthanoid, an element of Group I of the Periodic Table, and an element of Group II of the Periodic Table.

8. A method of production of a silicon carbide single crystal by precipitation from a solution using a temperature gradient furnace giving a temperature gradient to a columnar workpiece in its longitudinal direction, comprising:

using as said temperature gradient furnace a temperature gradient furnace provided with heat insulating walls surrounding an outer circumference of said columnar workpiece, a heating unit for heating a bottom end of said columnar workpiece through a heating susceptor, and a cooling unit for cooling a top end of said columnar workpiece through a cooling susceptor;

stacking, inside said furnace in order from the bottom, a source material rod comprised of silicon carbide, a solvent, a seed crystal, and a support rod supporting said seed crystal at the bottom end of the support rod so as to form said columnar workpiece, heating a bottom end of said source material rod as said bottom end of the columnar workpiece by said heating unit, and cooling a top end of said support rod as said top end of the columnar workpiece by said cooling unit so as to form a temperature gradient inside said columnar workpiece so that the top end face becomes lower in temperature than the bottom end face of said solvent; and causing a silicon carbide single crystal to grow continuously downwardly starting from said seed crystal, wherein said method further comprises:

using as said source material rod a source material rod provided with a counter bore of an inside diameter equal to an outside diameter of said seed crystal on the top face and pulling said support rod at the time where a predetermined thickness of the single crystal is grown so as to remove said single crystal from said solvent.

9. A method of production of a silicon carbide single crystal as set forth in claim 8, further comprising surrounding said columnar workpiece with an heat insulating cylinder interposed between said heat insulating walls and said columnar workpiece, making a bottom end part of said support rod to have a shape with an outside diameter larger than other parts of said columnar workpiece, and bringing an outer circumferential face of the bottom end part of said support rod into contact with an inner circumferential face of said heat insulating cylinder.

10. A method of production of a silicon carbide single crystal as set forth in claim 9, further comprising using a top end holder of said support rod provided with a buffer mechanism allowing free rise of said support rod.

11. A method of production of a silicon carbide single crystal as set forth in claim 8, further comprising using a top end holder of said support rod provided with a buffer mechanism allowing free rise of said support rod.

* * * * *